United States Patent [19]

Brunner

[11] 4,183,659
[45] Jan. 15, 1980

[54] MEANS FOR CONTROLLING THE CHANGE OF THICKNESS OF LINES OF PHOTOGRAPHICALLY PRODUCED BRIEFS PRODUCIBLE BY THE AGENCY OF A MEANS FOR PHOTOGRAPHIC REPRODUCTION

[76] Inventor: Felix Brunner, Corippo, Switzerland

[21] Appl. No.: 919,575

[22] Filed: Jun. 27, 1978

[30] Foreign Application Priority Data

Jun. 30, 1977 [CH] Switzerland ..................... 8083/77

[51] Int. Cl.$^2$ .................... G03B 27/52; G03B 27/32
[52] U.S. Cl. ..................................... 355/40; 355/77
[58] Field of Search .................. 355/77, 52, 40, 39; 354/5–8, 10, 11

[56] References Cited

U.S. PATENT DOCUMENTS

| | | | |
|---|---|---|---|
| 1,808,123 | 6/1931 | Uher | 355/40 |
| 3,220,301 | 11/1965 | Koonz et al. | 355/40 |
| 3,620,622 | 11/1971 | Goodwin | 355/77 X |
| 3,785,733 | 1/1974 | Bender | 355/77 |

*Primary Examiner*—Donald A. Griffin
*Attorney, Agent, or Firm*—Ladas, Parry, Von Gehr, Goldsmith & Deschamps

[57] ABSTRACT

A means for controlling the change of thickness of lines of photographically produced briefs which are producible by the agency of a means for photographic reproduction. A control area means comprises at least two area element means, whereby the smallest width of which and the smallest mutual distance of which corresponds to the tolerance of the thickness of lines of a print.

4 Claims, 6 Drawing Figures

MEANS FOR CONTROLLING THE CHANGE OF THICKNESS OF LINES OF PHOTOGRAPHICALLY PRODUCED BRIEFS PRODUCIBLE BY THE AGENCY OF A MEANS FOR PHOTOGRAPHIC REPRODUCTION

BACKGROUND OF THE INVENTION

1. Field of the Invention

The present invention relates to a new and improved means for controlling the change of thickness of lines of photographically produced briefs which are producible by the agency of a means for photographic reproduction.

2. Description of the Prior Art

Recently the graphical art is experiencing an accelerated changing from the use of the leaden printing plate for types or briefs, respectively, to the use of photographically produced briefs. It is a rather easy task to estimate at which point of time in central and western Europe only books of a bibliophilic character will be printed by the agency of leaden printing procedures. The reason for this situation is the fact that the above indicated new technique causes considerable savings on time and space for the graphic business. On the other hand, however, it also produces new technical problems. Specifically the problem regarding the maintenance of quality of a photographically produced brief is vastly different than such of a brief produced by leaden means.

Presently, the composing of a photographically produced brief or document proceeds with the aid of a light source, of a brief storage means (print carrier of a photographically produced brief), a scale or magnitude, respectively means, of a means for setting the distance or gap between characters (letters or types), respectively, and of one or two cassettes for the photographic material.

During the production of photographically produced briefs by means of the projection procedure a light source (incandescent light or flash light) illuminates a negative of a letter or type, respectively, and projects such in the desired scale by the agency of a magnifying optical arrangement onto a photographic material.

During such production by means of beams the light source of the projecting means provided with a guidable cathodic or laser beam composes or assembles the letter or type, respectively, in the desired size linewise or point(dot)-wise on the photographic material. Thereby, it follows a screening program of another light source scanning the negative of the figure, i.e., letter or type. It is, however, also possible to utilize digitally stored information for guiding the printing beam. The illuminated letter or type, respectively, of the brief manufactured by a means of a beam is thus composed of a plurality of lines or dots, respectively, which cannot be individually recognized by the naked eye simply because its capability regarding the resolution does not suffice.

Upon examination of the features which govern the quality of the reproduction of a print two different groups of deficiencies can be detected: A first group encompasses deficiencies regarding the positioning of the letters or types, respectively, a second group encompasses the deformation of the letters or types, respectively. Positioning errors are slanted letters or types, respectively, insufficient maintenance of lines, irregular spacing between letters or types, respectively, and irregular slugs. A deformation of the print involves a flattening of corners combined with a loss of the inner and outer contours, a breaking of or interruption of serifs, a slurred contour and a change of the line thickness.

Undesirable variations of the thickness of the lines result in the individual letter, type, words, lines or complete sections of a text or even pages appearing to be fatter or narrower than intended. Printed matter suffering from such deficiencies appear to be unkempt and furthermore the ease of reading suffers because a reader is not certain if a fatter line is meant to be an intended stressing in the text or if it is due to an unintentional technical deficiency. Thus an avoidance of unwanted changes of the thickness of letters or types, respectively, being beyond the tolerance acceptable by eye is of utmost importance with regard to ensuring the quality of the photographically produced brief.

Changes of the thickness of lines can occur during several production steps: The optical system of the illumination unit of the apparatus for photographically producing briefs can incorporate deficiencies and thus produce irregular results, the light source itself can be subject to variations or changes due to aging which usually immediately brings about a change of the thickness of lines in the brief. Furthermore, the film emulsion used for the photographic production of the brief can feature irregularities or the development of the film can lead to irregular results, which again takes the shape of changes of the thickness of lines. At the copy of the film of the photographically produced brief on the offset printing plate there can also occur changes of the thickness of lines as well as during the following printing step.

In order to measure the changes of the thickness of lines in the photoprint brief there are known generally two methods:

(1) the microscopic measuring method and
(2) the densitometric measuring method.

When following the microscopic measuring method there is utilized a microscope which enlarges 100 times or more and comprises a graduation of 0.01 mm or less. With such instrument the width of the line of letters or type, respectively, can be measured directly. Such method is suitable for detecting the tolerances of the changes of the thickness of lines which still is accepted by the eye of the reader. However, such method is too complicated and bothersome for checking initially set tolerances on a day-by-day production practice. Microscopes having a magnifying power of 1:100 are already laboratory instruments and uncommon to operators for the production of photographic briefs. Thereby, the field of vision is that small that it usually does not even detect a complete letter or type, respectively, which renders the search of suitable measuring areas of the print quite difficult.

The densitometric method is based on the recognition that a broadening of the print and a broadening of the screen dots are due to the same reason and thus can be detected by means of the identical measuring methods. A broadening of the screen dots produces a darker screen area which accordingly produces a higher density value when carrying out a measurement by means of the densitometer.

If now a suitable raster or screen area such as, e.g., a micro measuring area is placed on the print carrier of a photographically produced brief at such place which is usually occupied by a negative of a letter or type, respectively, and furthermore, such screen area is illuminated similar to the illumination of a letter or type, respectively, on a film for the photographic production of a brief this area can upon its development be measured with the aid of a densitometer. Upon a stronger illumination which produces on the one hand an increase of the thickness of lines of the letters or types, respectively, and on the other hand a darkening of the screen or raster area the densitometer will indicate a higher value. Upon a weaker illumination which produces a decrease of the thickness of lines and a brightening of the screen area the densitometer will indicate a lower density value.

Both described measuring methods are suitable for setting standard or base values of the thickness of lines and also for finding the tolerances of the change of the thickness of lines still and just tolerable by the human eye. Thus tolerance values are used for settings such as which are made with the aid of rows of tests.

Such a row of tests can be produced as follows: With regard to a specific letter or type, respectively, form and letter or type, respectively, size there is set by means of tests such thickness of line which produces an optimal picture of the letters or types, respectively, with regard to legibility and appearance. By utilizing the set thickness of line several photographically produced brief blocks are illuminated. Within these brief blocks, however, individual lines are purposely illuminated with varying illumination times such that such lines appear to be fatter or narrower than the rest of the text. Thereafter testing personnel sets the critical change of the intensity of lines at which fatter or narrower ("leaner") letters or types or texts appear to be disturbing for the eye.

The critical change of the thickness of lines, which will be referred to hereafter as tolerance of the thickness of lines, changes to a small extent between type forms and also between sizes of type. Larger sizes of type allow a somewhat larger tolerance of the thickness of lines in comparison with smaller sizes of type. The tolerance of the thickness of lines can be given in terms of micrometers or differences in density for a predetermined screen area.

The nominal value and the tolerance of the intensity of lines can be in accordance with above described methods set for any type form and type size. Because this is an only one time procedure the necessary expenditure of work and time is of no importance. However, it is quite a different task when checking on a day-by-day basis the originally set nominal values and tolerances during the regular production of photographically produced briefs. In such case the above mentioned methods are due to their necessary daily repetition cumbersome.

Accordingly, there is a need in the practice of a means which allows a speedy control of the nominal values and tolerances by utilizing simple devices.

SUMMARY OF THE INVENTION

Hence, it is a general object of the present invention to provide an improved means for controlling the change of thickness of lines of photographically produced briefs or document which are producible by the agency of a means for photographic reproduction which satisfies the above requirements.

Now in order to implement these and still further objects of the invention, which will become more readily apparent as the description proceeds, the means for controlling the change of thickness of lines of this development is manifested by the features that there is provided a control area means comprising at least two area element means, the smallest width of which and the smallest mutual distance of which correspond to the tolerance of thickness of lines of a print.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
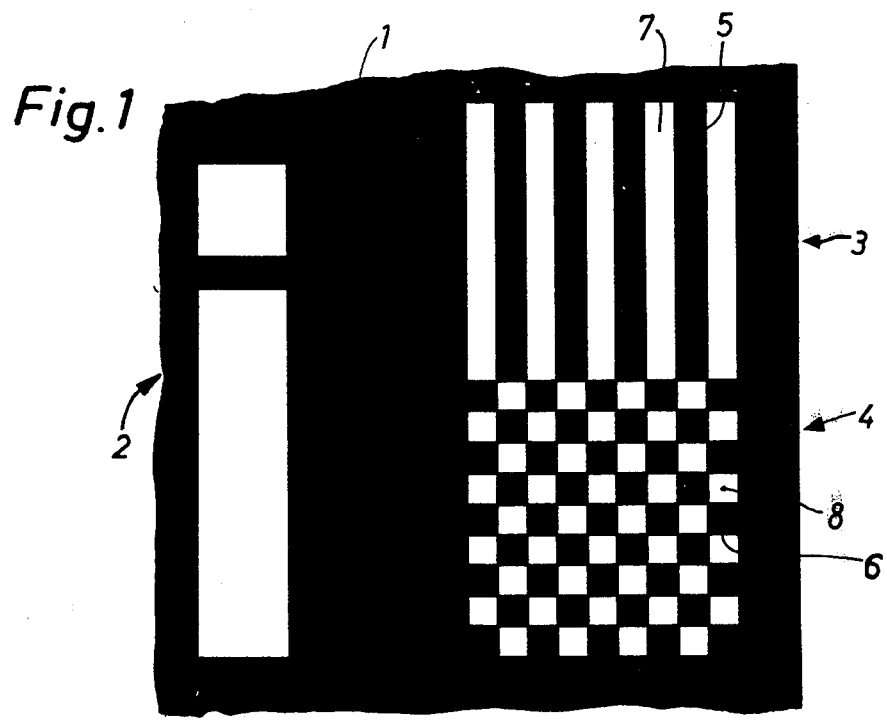
FIG. 1 is a view of a section of a print carrier of a photographically produced brief shown on a strongly enlarged scale, which print carrier carries the letter "i" along with two embodiments of the invention.

In FIG. 1 there is shown a section of a print carrier 1 of a photographically produced brief or document drawn in a strongly enlarged scale. On said carrier 1 manufactured commonly of glass there is shown a character (the letter i) denoted with the reference numeral 2, along with two possible embodiments 3 and 4 at the present control means. The black drawn surface areas 5 or 6, respectively, are in this control means opaque, whereby the white drawn surface areas 7 or 8, respectively, are translucent.

The first embodiment 3 of the inventive control means is shown in the form of a line screen or line grating. The second embodiment 4 of the inventive control means is shown in the form of a square screen or square grating. Thereby, the width of the opaque and of the translucent lines or squares, respectively, of the control devices or members shown correspond to the tolerance of the thickness of lines of such printed form which is present on the print carrier of a photographically produced brief in question.

FIG. 1 discloses further, that the width of the opaque and of the transparent lines 5, 7 and squares 6, 8, respectively, of the present control means amounts to practically $\frac{1}{3}$ of the width of the letter i. The length of the lines 5 and 7, respectively, of the first embodiment of the present control means is indeed somewhat shorter than the height of the respective letter 2; however, it lies within the scope of the present invention that said height can be either the same as or possibly even larger than the height of mentioned letter.

With regard to the number of lines 5 and 7, respectively, it is obvious that at least two surface elements 5 and 7, respectively, must be present. It is obvious that the control of the changes of the thickness of lines can be carried out the easier the larger the number of lines 5 and 7, respectively, or squares 6 and 8, respectively, present on the control means.

It can be seen that the present control means comprises at least one screen or raster area 3 and 4, respectively, the screen dots 6 and 8, respectively, or screen lines 5 and 7, respectively, of which correspond with regard to their widths and smallest distances or gaps exactly to the tolerances of the thickness of lines. During the photographic production of a brief said raster areas 3 and 4, respectively, are arranged like a common letter at the end of a line or a text column on the print carrier and thereafter will be simultaneously exposed and developed therewith. If now during the exposure and development of the photographic print carrier an increase of the thickness of lines occurs, which increase reaches the critical limit, i.e., the tolerance of thickness of lines, the fine lines or screen dots, respectively, in the screen area of the control device broaden simultaneously such that the intermediate spaces or gaps will be just filled out such that the complete screen area will turn completely black, a condition which can be easily detected by the naked eye or by use of a magnifier.

In contrast thereto, should during the exposure and development of the photographically produced brief a decrease of the thickness of lines occur, which decrease reaches the lower tolerance limit, the fine lines or screen dots in the screen or raster field of the control means decrease to such an extent that they disappear completely, which again is easily ascertainable.

The control means allows a recognition of deficiencies of the photographically produced brief with regard to the thickness of lines immediately after the development of the film. Conclusively such a deficient print carrier, or brief, respectively, can be removed early prior to a further processing thereof, instead of recognizing a deficiency not earlier than on the final printed matter, sheet, etc., whereby then the damage incurred in such instance is worse. The present control means allows further a judgement as to how a production operation of a photographically produced brief on a print carrier must be repeated such that the recognized deficiency does no longer occur during the repetition of the production operation.

In the following, the operative use of the present control means as well as a further embodiment thereof will now be explained still more in detail.

Figure 2:
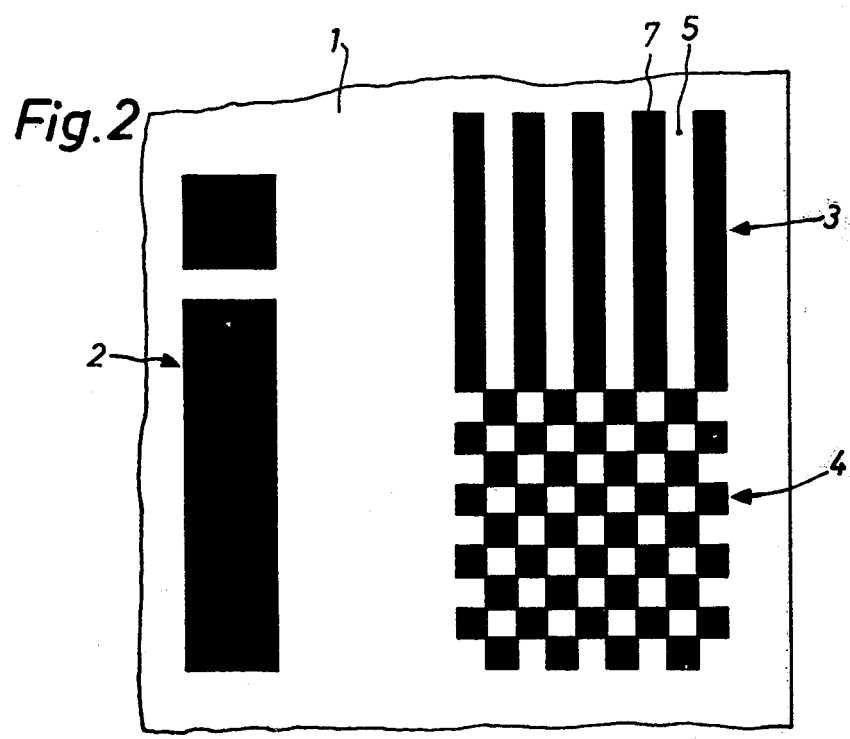
FIG. 2 is a view of a section similar to the section shown in FIG. 1 of an exposed and developed film of a photographically produced brief, whereby said section is produced by means of a projection.

In FIG. 2 there is shown a view of a section of an exposed and developed film of a photographically produced brief which has been produced by projecting the pattern of FIG. 1. In this case no change of the thickness of lines has been suffered, and accordingly, the widths of the letter i as well as of the control means 3 and 4 shown remain unchanged; however, in a photographical sense they are positive. The control means 3 and 4 shown exist yet as screen or raster field.

Figure 3:
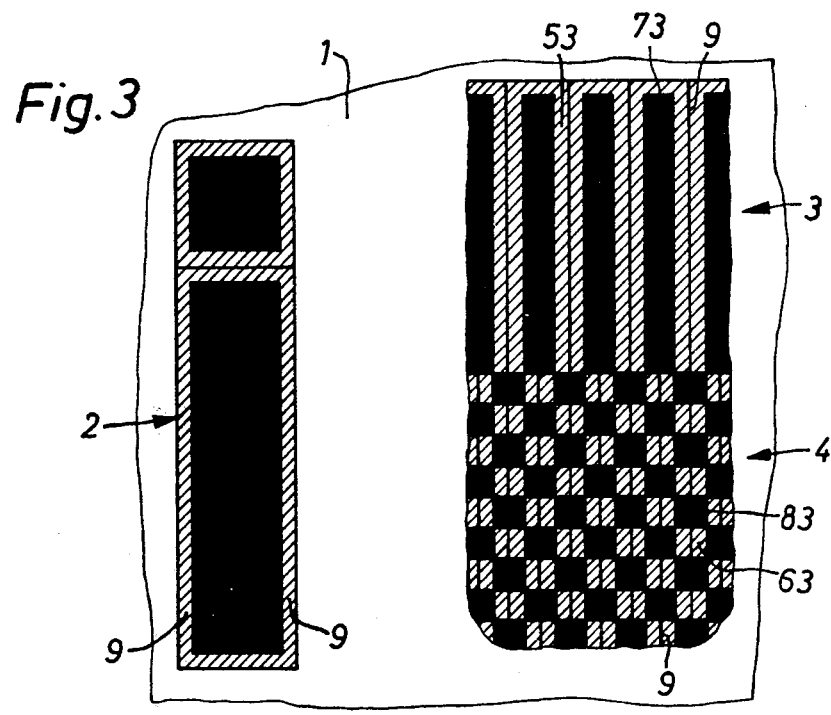
FIG. 3 is a view of the section of FIG. 2 in which an increase of the thickness of the lines has taken place.

In FIG. 3 there is now shown the corresponding section of an exposed and developed film, i.e., print carrier of a photographically produced brief, whereby an increase of the thickness of lines has been suffered, which, however, lies within the tolerance of the thickness of lines. To the letter i which is identified by the reference numeral 2 there is now added a contour 9 or edge area, respectively, such that a fatter or thicker letter i has been produced. Thereby, it is presumed that the sum of two opposite contour widths 9 is equal to the tolerance of the thickness of lines. In FIG. 3 the same growth 9 is discernible at lines 73 and squares 83 of the control means 3 and 4. Thereby, the contours 9 fill the intermediate space 63 and 53, respectively, between the screen dots 73 and 83, respectively, of the control means 3 and 4 just out, because said distance or gap, respectively, corresponds exactly to the tolerance of the thickness of lines, i.e., has the same extent. Thus the screen area of the control means is pictured on the film of the photographically produced brief in form of a complete or uninterrupted area which can easily be recognized optically.

Figure 4:
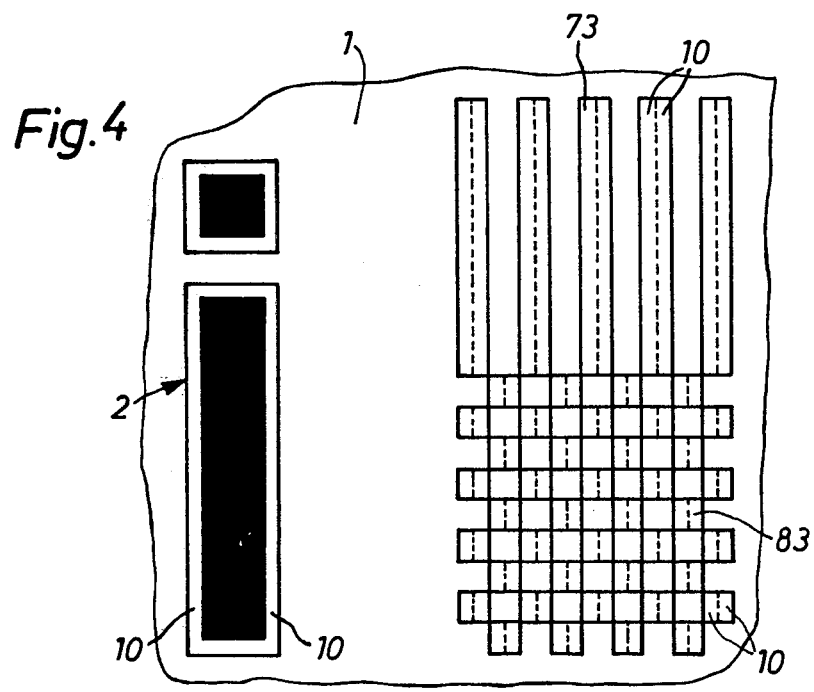
FIG. 4 is a view of the section of FIG. 2 in which a decrease of the thickness of the lines has taken place.

In FIG. 4 the corresponding section 1 of an exposed and developed print carrier of a photographically produced brief is shown, whereby there occurred a decrease of the thickness of lines which just corresponds to the tolerance of the thickness of lines. The letter i designated with the reference numeral 2 has been changed to a narrower letter due to the cancelling out or elimination of a contour 10 or edge area. Thereby the sum of the oppositely located contours 20 is equal to the tolerance of the thickness of lines. A similar decrease occurred at the lines 53 and squares 83 of the control means. Thereby the contours cause the width of the lines 73 and screen dots 83 of the control means to be reduced to zero such that these lines 73 and screen dots 83 disappear. Thereby this screen area of the control means will be illustrated on the film of the photographically produced brief as a blank area which can be optically easily recognized.

In the above described easy cases it is surmised that the converging or disappearing, respectively, of the lines or screen elements is exclusively based upon or due to an increase or decrease, respectively, occurring during the exposure or further processing of the film of the print carrier. This easiest case presupposes, that the resolving power of the optical system of the apparatus for producing photographically produced briefs as well as the resolving power of the utilized photographic layers is infinitely high, or at least considerably higher than the tolerance of the thickness of lines.

In physical terms the resolving power is commonly given in pairs of lines per centimeter or pairs of lines per millimeter and defines as such the finest width of line which can be reproduced. Now, the resolving power of apparatuses for the photographic production of printing plates as well as of the common photographically produced printing plates is usually limited. For this reason the lines or screen dots of the control means do not disappear after a printed area has exceeded or fallen short of the tolerance of the thickness of lines, they rather disappear already when the limit set by resolving power has been reached. In order to take this fact into consideration the width of the control elements, may this be the lines or the screen dots, is chosen such, that it corresponds to the sum of both widths, which on the one hand can be deduced from the tolerance of the width of lines and on the other hand from the resolving power.

The following example is to illustrate this fact: It shall be assumed that the tolerance of the thickness of lines of a specific size of type is ±6 micrometers. Accordingly, the width of the lines and their mutual distances, i.e., the gaps in the control means will have to amount to 6 micrometers without taking the resolving power into consideration. The resolving power of the utilized apparatus for the photographic production of the briefs shall amount to 500 pairs of lines per centimeter.

It thus follows that a pair of lines which still and just can be reproduced has a total width of 20 micrometers, accordingly the width of a single positive or negative line must amount to 10 micrometers. It is not possible to reproduce thinner or narrower lines, such lines disappear or converge to an uninterrupted area. Conclusively, the width of the lines or the diameter of the screen dots, respectively, of the control means must be 6 plus 10=16 micrometers.

Figure 5:
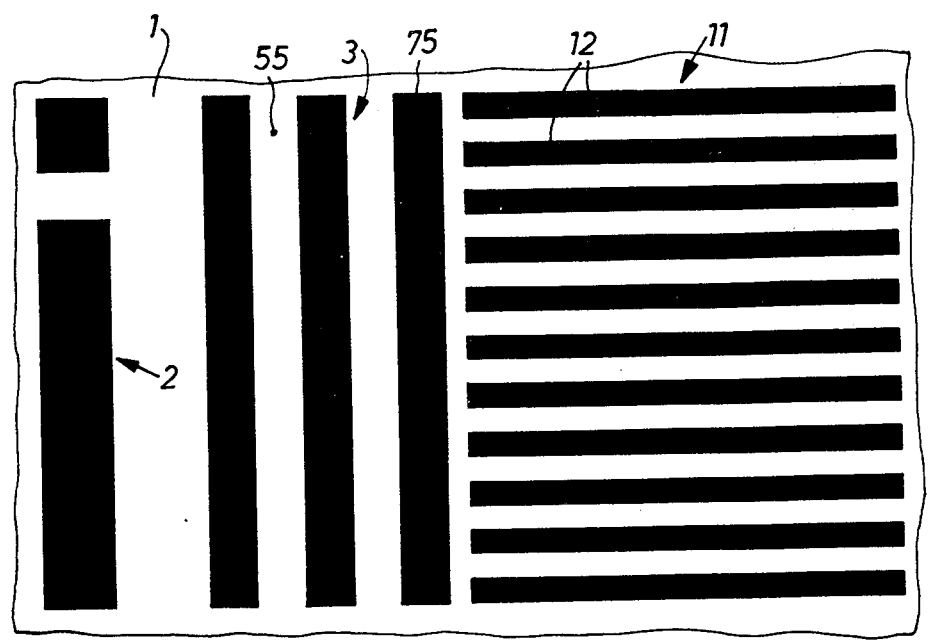
FIG. 5 is a view of a further embodiment of the present control means shown on a strongly enlarged scale, which control means was produced photographically in a manner similar to the production of the means of FIG. 2.
Figure 6:
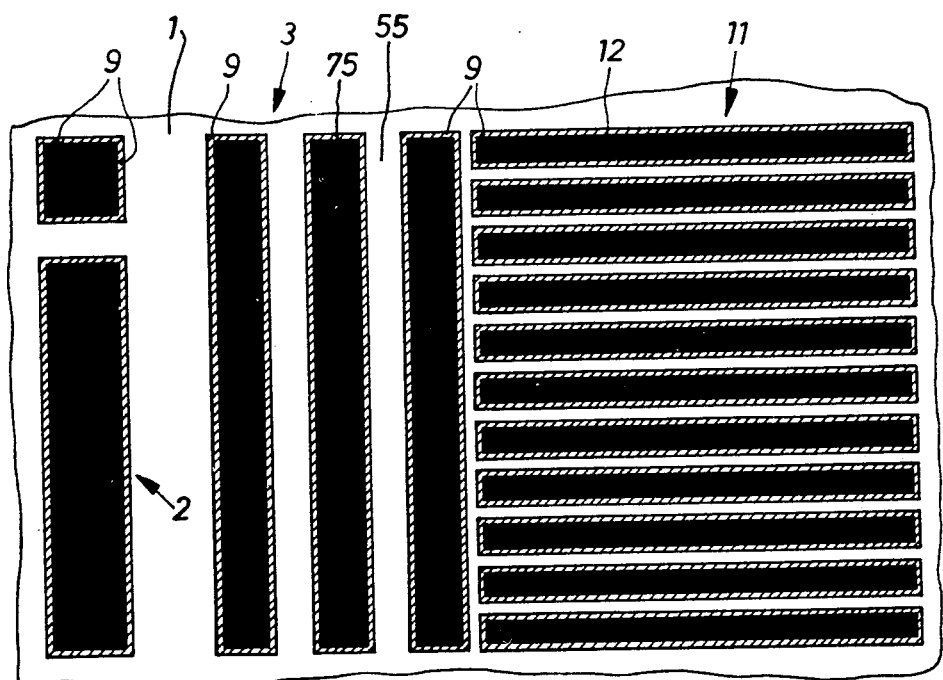
FIG. 6 is a view of the means shown in FIG. 5, whereby an increase of the thickness of the lines has taken place.

A view of a further embodiment of the inventive control means is shown in FIGS. 5 and 6. In FIG. 5 there is shown the first of the control means 3 of FIG. 1 including the letter i, denoted 2. This view of the control means 3 is designed in FIG. 5, such as produced by a projection of the control means 3 depicted in FIG. 1. To this control area or screen area 3, the screen dots or screen lines 75 which correspond to the tolerance of the thickness of lines, a further control area or screen area 11, respectively, is added alongside thereof. The screen dots or screen lines 12, respectively, of this further control area or screen area 11, respectively, are indeed finer or coarser; however, they define together an area with a same intensity, i.e., a same coverage of area as such of the first described screen area 3. The smallest diameter of the strip or weblike area elements 75 of the first control means 3 and their smallest mutual distance or gap 55 is larger (in the present embodiment twice the size) than the corresponding area elements 12 in the additional control area or field 11. The area elements 75 define in their entirety the first area 3, whereby the area elements 12 define in their entirety the second field 11. The area coverage of both areas 3 and 11 relative to their area elements 25 and 12, respectively, is the same, and in the shown embodiment it amounts to practically 50%. Accordingly, these area elements cover 50% each of the complete area defined by the corresponding fields 3 and 11, respectively, to which they belong. However, these two areas can also cover total areas of unequal size.

Visually, both screen areas 3 and 11 formed as described above appear to possess the same degree of luminosity or brightness; they differ, however, with regard to their raster detail or definition and accordingly with regard to their behavior during changes of the thickness of lines. In case that during the projection or transferring the photographic brief suffers a change of the thickness of lines, lines 75 or 12, respectively, or the screen dots of the first as well as of the second area 3 or 11, respectively, broaden or get narrower. Because, however, the screen area possessing coarser lines or screen dots features due to geometrical reasons a smaller sum of edge areas per area surface unit a change of the thickness of lines in such coarser screen area causes a smaller shift of the intensity than would occur in a finer screen area. Accordingly, a difference regarding luminosity or intensity occurs between said two screen areas, which difference is discernible by the human eye, but can also be measured by means of a densitometer. If now the first screen area darkens relative to the coarser screen area there has occurred an increase of the thickness of lines, and conversely, if a brightening has occurred a decrease of the thickness of lines has happened. In case both areas retain the same intensity no change of the thickness of lines has occurred.

Because in area 11 the so-called sum of the edge area of the area elements is larger (in the embodiment shown twice as large) than in area 3, a same increase of the thickness of lines in this area produces a more intense increase of the area than is the case in the neigboring area 3 and accordingly, a more intense turning dark. The letter i denoted with reference numeral 2 has turned into a fatter letter due to the addition of a contour or edge area 9. The same contours 9 have been added to the strip-like area elements 53 or 12, respectively, of the areas 3 and 11. Because, however, area 11 possesses many more area elements 12 (double the amount) than the first area 3 it experiences a stronger increase of intensity due to these added contours than area 3 experiences. This change of intensity is visually and densitometrically discernible and serves as measure for the change of a thickness of lines.

While there are shown and described present preferred embodiments of the invention, it is to be distinctly understood that the invention is not limited thereto, but may be otherwise variously embodied and practiced within the scope of the following claims. Accordingly,

What is claimed is:

1. A means for determining whether a photographic reproduction of a document falls within predetermined tolerance limits imposed upon changes which may take place upon photographic reproduction of the document in the thickness of a line of a legible character of the document, comprising a control area provided with at least two mutually spaced area elements, the minimum width of each element corresponding to the tolerance imposed on reductions in the thickness of the line and the minimum space between said elements corresponding to the tolerance imposed on increases in the thickness of the line, whereby upon the tolerance imposed on reductions in thickness being exceeded in photographic reproduction of the control area the area elements substantially disappear whereas upon the tolerance imposed on increases in thickness being exceeded in photographic reproduction of the control area the area elements merge into each other across the space therebetween.

2. The means as defined in claim 1, for determining whether a photographic reproduction of a document, formed using photographic reproduction means capable of just reproducing a line of a predetermined thickness but incapable for reproducing a line thinner than said predetermined thickness, falls within said predetermined tolerance limits, wherein the minimum thickness of each element is equal to the sum of the tolerance imposed on reductions in thickness plus said predetermined thickness and the minimum space between said elements in equal to the sum of the tolerance imposed on increases in thickness plus said predetermined thickness.

3. The means as defined in claim 1 or 2, wherein said area elements are shaped as strips, rectangles or squares.

4. The means as defined in claim 1 or 2, wherein there is provided alongside said control area a second control area provided with at least two mutually spaced area elements, the minimum width of each element of said second control area and the minimum space between said elements of said second control area both being either greater or less than the minimum width of each element of the first-mentioned control area and the minimum space between said elements of the first-mentioned control area, respectively.

* * * * *